(12) United States Patent
Wang et al.

(10) Patent No.: US 11,501,559 B2
(45) Date of Patent: Nov. 15, 2022

(54) FINGERPRINT IDENTIFICATION SUBSTRATE AND DISPLAY DEVICE

(71) Applicant: BOE Technology Group Co., Ltd., Beijing (CN)

(72) Inventors: Lei Wang, Beijing (CN); Xiaoliang Ding, Beijing (CN); Yingzi Wang, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 0 days.

(21) Appl. No.: 17/218,256

(22) Filed: Mar. 31, 2021

(65) Prior Publication Data

US 2022/0067326 A1    Mar. 3, 2022

(30) Foreign Application Priority Data

Aug. 27, 2020    (CN) .......................... 202010877115.4

(51) Int. Cl.
| | | |
|---|---|---|
| *G06F 1/16* | (2006.01) | |
| *G06V 40/13* | (2022.01) | |
| *G06V 10/145* | (2022.01) | |
| *H01L 27/146* | (2006.01) | |
| *H01L 27/32* | (2006.01) | |

(52) U.S. Cl.
CPC ........ *G06V 40/1318* (2022.01); *G06V 10/145* (2022.01); *G06V 40/1324* (2022.01); *H01L 27/14621* (2013.01); *H01L 27/14623* (2013.01); *H01L 27/14625* (2013.01); *H01L 27/14636* (2013.01); *H01L 27/14678* (2013.01); *H01L 27/3234* (2013.01)

(58) Field of Classification Search
CPC ........... G06V 40/1318; G06V 40/1324; G06V 10/145; H01L 27/14621; H01L 27/14623; H01L 27/14625; H01L 27/14636; H01L 27/14678; H01L 27/3234; G06F 1/1684
See application file for complete search history.

(56) References Cited

U.S. PATENT DOCUMENTS

| | | | |
|---|---|---|---|
| 2019/0050621 A1* | 2/2019 | Xu ..................... | G06V 40/1318 |
| 2020/0119108 A1* | 4/2020 | Park .................... | H01L 27/3234 |
| 2021/0295007 A1* | 9/2021 | Yoo ....................... | G06F 1/1684 |

* cited by examiner

*Primary Examiner* — Abdul-Samad A Adediran
(74) *Attorney, Agent, or Firm* — ArentFox Schiff LLP; Michael Fainberg

(57) ABSTRACT

The present disclosure provides a fingerprint identification substrate and a display device. The fingerprint identification substrate includes a base substrate, a plurality of photosensitive modules on the base substrate, a collimating optical structure located on light entering sides of the photosensitive modules, a plurality of function layers and an insulation layer between every two adjacent function layers; where the photosensitive modules are configured to collect light rays reflected by a fingerprint; and the collimating optical structure includes light shading layers and light transmitting layers arranged alternately; where each of the light shading layers has a plurality of light transmitting holes; orthographic projections of the light transmitting holes on the base substrate are in orthographic projections of the photosensitive modules on the base substrate.

15 Claims, 8 Drawing Sheets

FINGERPRINT IDENTIFICATION SUBSTRATE AND DISPLAY DEVICE

This application claims priority to the Chinese Patent Application No. 202010877115.4, filed to the China Patent Office on Aug. 27, 2020, the entire contents of which are incorporated herein by reference.

FIELD

The present disclosure relates to the technical field of displaying, in particular to a fingerprint identification substrate and a display device.

BACKGROUND

Along with increasing development of terminal technologies, electronic equipment is applied more and more widely. As skin texture like fingerprint patterns or palm print patterns is unique, a fingerprint identification function is applied to the electronic equipment more and more popularly in order to protect the information security of users, e.g. mobile phone unlocking, mobile payment (like payment and money transfers), etc.

SUMMARY

Embodiments of the present disclosure provide a fingerprint identification substrate and a display device.

The fingerprint identification substrate includes a base substrate, a plurality of photosensitive modules located on the base substrate, a collimating optical structure located on light entering sides of the photosensitive modules, a plurality of function layers and an insulation layer located between every two adjacent function layers;

where the photosensitive modules are configured to collect light rays reflected by a fingerprint; and the collimating optical structure includes light shading layers and light transmitting layers arranged alternately;

where each of the light shading layers has a plurality of light transmitting holes; orthographic projections of the light transmitting holes on the base substrate are located in orthographic projections of the photosensitive modules on the base substrate; light transmitting holes of one of the functional layers and light transmitting holes of another of the light shading layers are mutually overlapped in a direction perpendicular to the base substrate; each light shading layer and one of the function layers share the same film layer; and each light transmitting layer and one of the insulation layers multiplex the same film layer.

In one possible implementation, in the fingerprint identification substrate provided by the embodiment of the present disclosure, centers of the orthographic projections of the mutually-overlapped light transmitting holes on the base substrate are the same.

In one possible implementation, in the fingerprint identification substrate provided by the embodiment of the present disclosure, the orthographic projections of the mutually-overlapped light transmitting holes on the base substrate completely coincide.

In one possible implementation, in the fingerprint identification substrate provided by the embodiment of the present disclosure, a diameter of each of the light transmitting holes is larger than or equal to 2 µm but smaller than or equal to 5 µm.

In one possible implementation, in the fingerprint identification substrate provided by the embodiment of the present disclosure, the light entering side of each of the photosensitive modules is one side facing away from the base substrate; the plurality of function layers include: a bias voltage metal layer, a noise-reduction metal layer and a shielding metal layer arranged on the sides, facing away from the base substrate, of the photosensitive modules in sequence; the bias voltage metal layer and a light shading layer which are arranged on a same layer are independent from each other; the noise-reduction metal layer and a light shading layer which are arranged on a same layer are independent from each other; and the shielding metal layer is multiplexed as a light shading layer.

In one possible implementation, in the fingerprint identification substrate provided by the embodiment of the present disclosure, the plurality of function layers further include: a first metal electrode layer located between a layer where the photosensitive modules are located and the bias voltage metal layer; the first metal electrode layer includes a plurality of first electrodes in one-to-one correspondence with the photosensitive modules; and the first electrodes are multiplexed as a light shading layer.

In one possible implementation, in the fingerprint identification substrate provided by the embodiment of the present disclosure, an insulation layer between the bias voltage metal layer and the noise-reduction metal layer is a first color-filtering resin layer, and an insulation layer between the noise-reduction metal layer and the shielding metal layer is a second color-filtering resin layer.

In one possible implementation, in the fingerprint identification substrate provided by the embodiment of the present disclosure, the light entering side of each of the photosensitive modules is one side facing the base substrate; the plurality of function layers include: a source-drain metal layer, a gate metal layer and an active layer arranged on the sides, facing the base substrate, of the photosensitive modules in sequence; and the source-drain metal layer and a light shading layer which are arranged on a same layer are independent from each other, the gate metal layer and a light shading layer which are arranged on a same layer are independent from each other, and the active layer and a light shading layer which are arranged on a same layer are independent from each other.

In one possible implementation, in the fingerprint identification substrate provided by the embodiment of the present disclosure, the plurality of function layers further include: a second metal electrode layer located between a layer where the photosensitive modules are located and the source-drain metal layer; the second metal electrode layer includes a plurality of second electrodes in one-to-one correspondence with the photosensitive modules; and the second electrodes are multiplexed as a light shading layer.

In one possible implementation, in the fingerprint identification substrate provided by the embodiment of the present disclosure, an insulation layer between the second metal electrode layer and the source-drain metal layer includes: a first insulation layer, a third color-filtering resin layer and a second insulation layer arranged in a laminated mode.

In one possible implementation, in the fingerprint identification substrate provided by the embodiment of the present disclosure, the plurality of function layers further include: a light shading metal layer located between the active layer and the base substrate and covering the active layer; and the light shading metal layer and a light shading layer which are arranged on the same layer are an integrated structure.

In one possible implementation, in the fingerprint identification substrate provided by the embodiment of the present disclosure, an insulation layer between the light shading metal layer and the active layer is a fourth color-filtering resin layer, an insulation layer between the active layer and the gate metal layer is a gate insulation layer, and an insulation layer between the gate metal layer and the source-drain metal layer is an interlayer dielectric layer.

In one possible implementation, in the fingerprint identification substrate provided by the embodiment of the present disclosure, the light shading layers are in ground joint through via holes of the insulation layers.

In one possible implementation, in the fingerprint identification substrate provided by the embodiment of the present disclosure, orthographic projections of the via holes of the insulation layers on the base substrate and the orthographic projections of the photosensitive modules on the base substrate are not overlapped mutually.

On the basis of the same inventive concept, an embodiment of the present disclosure provides a display device, including: the fingerprint identification substrate and a self-luminous display module located on a light entering side of the fingerprint identification substrate.

DETAILED DESCRIPTION OF THE EMBODIMENTS

In order to make objectives, technical solutions and advantages of embodiments of the present disclosure clearer, the technical solutions in the embodiments of the present disclosure will be clearly and completely described below with reference to the accompanying drawings of the embodiments of the present disclosure. It should be noted that sizes and shapes of all figures in the accompanying drawings do not reflect real scales but are only used for illustrating the contents of the present disclosure. Same or similar reference numbers represent same or similar elements or elements with same or similar functions all the time. Apparently, the described embodiments are part of embodiments of the present disclosure instead of all the embodiments. On the basis of the described embodiments of the present disclosure, all of the other embodiments obtained by those ordinarily skilled in the art without creative work fall within the protection scope of the present disclosure.

Unless otherwise defined, technical terms or scientific terms used herein should have common meanings understood by those ordinarily skilled in the art of the present disclosure. "First", "second" and similar words used in the specification and claims of the present disclosure are only used for distinguishing different components rather than represent any sequence, quantity or significance. "Comprise" or "include" and other similar words denote that elements or items appearing before the words contain elements or items and their equivalents listed after the words without excluding other elements or items. Words such as "inner", "outer", "up" and "down" are only used for representing relative position relations, and when an absolute position of a described object changes, the relative position relations may change correspondingly.

Figure 1:
FIG. 1 is a schematic structural diagram of a display device in a related art.

A known mature fingerprint identification technology achieves fingerprint identification in a mode that a fingerprint identification (sensor) substrate 1 and a collimating optical structure 2 are attached through an optical adhesive 3 and then put below an organic light-emitting diode (OLED) display module 4, as shown in FIG. 1. The fingerprint identification substrate 1 and the collimating optical structure 2 serve as a fingerprint identification module and are put on a middle frame of a mobile phone, and a certain air gap exists between the fingerprint identification module and the OLED display module 4. The solution is mainly used for a common curved OLED mobile phone having an OLED display module 4 being 1.1 mm to 1.2 mm in thickness.

Besides a thick common curved OLED mobile phone, in the market, there is a thin (generally 0.5 mm to 0.6 mm) foldable screen and a thinner flexible screen which is not used for business yet. Taking the foldable screen as an example, as there is no middle frame, the fingerprint identification module may only be attached to the lower portion of the OLED display module 4. Generally, a supporting steel sheet needs to be arranged below the OLED display module 4 of the foldable screen, thus the fingerprint identification module must be put between the OLED display module 4 and the supporting steel sheet, which requires that the fingerprint identification module is quite thin.

Figure 2:
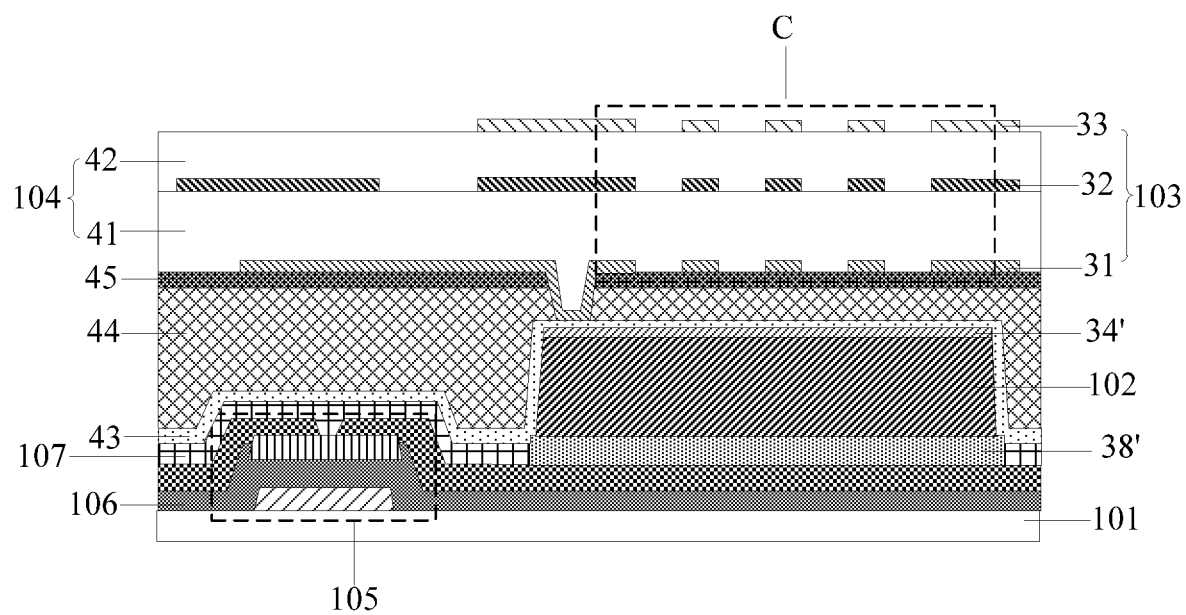
FIG. 2 is a first schematic structural diagram of a fingerprint identification substrate provided by an embodiment of the present disclosure.
Figure 3:
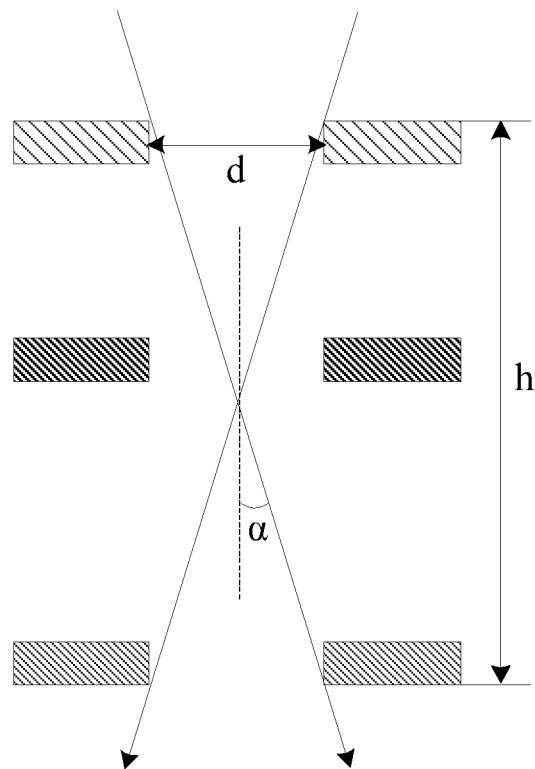
FIG. 3 is a collimating effect drawing of a collimating optical structure provided by an embodiment of the present disclosure.

An embodiment of the present disclosure provides a fingerprint identification substrate, as shown in FIG. 2 and FIG. 3, including: a base substrate 101, a plurality of photosensitive modules 102 located on the base substrate 101, a collimating optical structure C located on light entering sides of the photosensitive modules 102, a plurality of function layers 103 and an insulation layer 104 located between every two adjacent function layers 103.

The photosensitive modules 102 are configured to collect light rays reflected by a fingerprint and may specifically include P-type semiconductor layers, intrinsic semiconductor layers and N-type semiconductor layers arranged in a laminated mode.

The collimating optical structure C includes light shading layers and light transmitting layers arranged alternately. Each of the light shading layers has a plurality of light transmitting holes, and orthographic projections of the plurality of light transmitting holes on the base substrate 101 are located in orthographic projections of the photosensitive modules 102 on the base substrate. Light transmitting holes of one of the function layers 103 and light transmitting holes of another of the light shading layers are mutually overlapped in a direction perpendicular to the base substrate 101. Each light shading layer and one of the function layers share the same film layer, and each light transmitting layer and one of the insulation layers multiplex the same film layer.

In the fingerprint identification substrate provided by the embodiment of the present disclosure, all the light shading layers included in the collimating optical structures C and the function layers 103 included in the fingerprint identification substrate are arranged on the same layers in a one-to-one correspondence mode, all the light transmitting layers included in the collimating optical structures C and the insulation layers 104 included in the fingerprint identification substrate are multiplexed in a one-to-one correspondence mode, the collimating optical structures C are embedded into the fingerprint identification substrate, thus the fingerprint identification substrate has functions of the collimating optical structures, the collimating optical structures C do not need to be arranged independently, and a thickness is reduced.

It should be noted that in the present disclosure, "share" specifically denotes that two components are manufactured through the same film layer, and patterns of the two components may be an integrated structure with only boundaries of the patterns intersecting, or be mutually independent or coincide completely. "multiplexed" specifically denotes that the two components are manufactured through the same film layer, and the patterns of the two components completely coincide.

In the fingerprint identification substrate provided by the embodiment of the present disclosure, in order to improve an effect of collimating the fingerprint reflected light rays by the collimating optical structures C, centers of orthographic projections of the mutually-overlapped light transmitting holes on the base substrate 101 may be arranged to be the same. In some embodiments, the orthographic projections of the mutually-overlapped light transmitting holes on the base substrate 101 may further be arranged to completely coincide. Certainly, in consideration of influence factors like processes, centers of orthographic projections of mutually-overlapped light transmitting holes in an actual product are allowed to deviate slightly, and sizes of the orthographic projections of the mutually-overlapped light transmitting holes in the actual product are allowed to be close.

Limited by the factors of processes and equipment, when the light transmitting holes are too small, the light transmitting holes may not be manufactured in the insulation layers 104. When the light transmitting holes are too large, the effect of collimating the fingerprint reflected light rays entering the light transmitting holes by the light transmitting holes is poor. Thus, in order to give consideration to the feasibility and the collimating effect, in the fingerprint identification substrate provided by the embodiment of the present disclosure, as shown in FIG. 3, a diameter d of each of the light transmitting holes may be larger than or equal to 2 μm but smaller than or equal to 5 μm, e.g. 2.5 mm.

Figure 4:
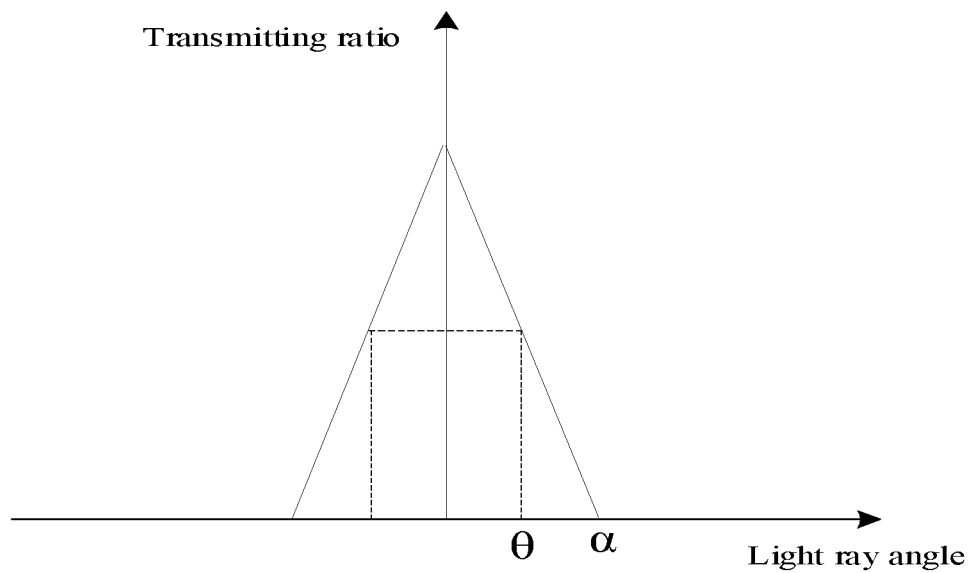
FIG. 4 is a diagram of a relation between an angle and a transmitting ratio of fingerprint reflected light rays transmitting through a collimating optical structure provided by an embodiment of the present disclosure.

Generally, as shown in FIG. 4, a half light receiving angle θ of each of the collimating optical structures C is half of a central peak a. It may be obtained by combining with FIG. 3:

$$\theta = \frac{\alpha}{2} = \frac{1}{2}\arctan\left(\frac{d}{h}\right),$$

where h represents a thickness of each of the collimating optical structures C. Taking a foldable screen with a typical thickness being 0.6 mm as an example, a half light receiving angle θ of a collimating optical structure C needs to be about 14°. When the diameter d of each of the light transmitting holes is 2.5 μm, the thickness h of each of the collimating optical structures C is 4.7 μm according to the above-mentioned formula. The thickness of each of the collimating optical structures C is illustrated only by an example above but is not limited to the size. During specific implementation, the thickness h of each of the collimating optical structures C is determined according to the needed half light receiving angle θ and diameter d of each of the light transmitting holes. Besides, as the film layers where the function layers 103 are located further maintain original functions of the film layers in the fingerprint identification substrate in addition to serving as the collimating optical structures C, while the insulation layers 104 only serve as insulation isolation layers, thus in order to avoid influence on the original functions of the function layers 103, the collimating optical structures C with certain thicknesses may be achieved by adjusting the insulation layers 104.

In the related art, the function layers 103 located on the sides, facing away from the base substrate 101, of the photosensitive modules 102 generally include: a bias voltage metal layer, a noise-reduction metal layer and a transparent shielding layer. The bias voltage metal layer (bias line) provides a bias voltage signal for the photosensitive modules 102. The noise-reduction metal layer (ONDC) blocks pixel columns formed by the photosensitive modules 102 at a left edge and a right edge of the fingerprint identification substrate and combines an algorithm for noise reduction so as to improve the accuracy of fingerprint identification. The transparent shielding layer may shield an electrical signal of a display module, so as to reduce interference with an electrical signal of the fingerprint identification substrate due to the electrical signal of the display module. In some embodiments, in order to share part of a film layer for making the transparent shielding layer as the collimating optical structure C, the transparent shielding layer may be replaced by a shielding metal layer. Based on this, in the fingerprint identification substrate provided by the embodiment of the present disclosure, as shown in FIG. 2, when the light entering side of each of the photosensitive modules 102 is one side facing away from the base substrate 101, film layers with the bias voltage metal layer 31, the noise-reduction metal layer 32 and the shielding metal layer 33 arranged on the sides, facing away from the base substrate 101, of the photosensitive modules 102 in sequence may be shared as light shading layers of the collimating optical structure C respectively. The bias voltage metal layer 31 and a light shading layer which are arranged on the same layer are independent from each other, the noise-reduction metal layer 32 and a light shading layer which are arranged on the same layer are independent from each other, and the shielding metal layer 33 is multiplexed as a light shading layer.

Figure 6:
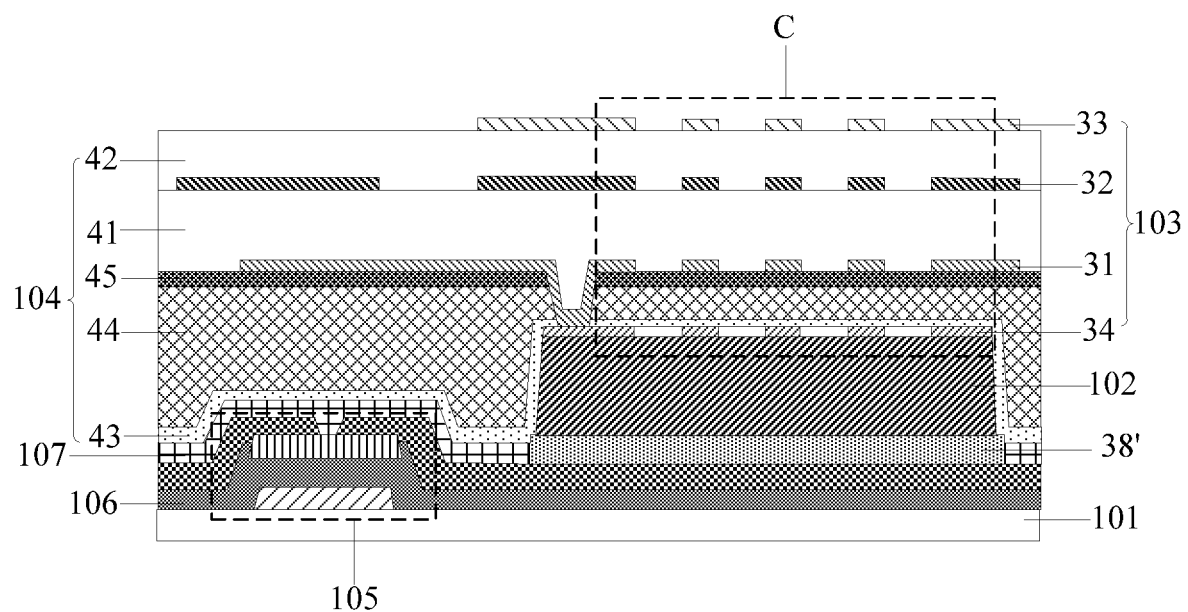
FIG. 6 is a second schematic structural diagram of a fingerprint identification substrate provided by an embodiment of the present disclosure.

The fingerprint identification substrate provided by the embodiment of the present disclosure, as shown in FIG. 2, may generally further include a transparent electrode 34' located between a layer where the photosensitive modules 102 are located and the bias voltage metal layer 31, so that the bias voltage signal provided by the bias voltage metal layer 31 is uniformly applied to the photosensitive modules 102 through the transparent electrode 34'. In order to prolong light paths of the fingerprint reflected light rays passing through the collimating optical structure C and reduce light crosstalk between the adjacent light transmitting holes, the transparent electrode 34' may be replaced by light-proof metal, and a light transmitting hole array corresponding to the film layer where the bias voltage metal layer 31 is located is manufactured. In other words, as shown in FIG. 6, the function layers 103 shared as the light shading layers included in the collimating optical structure C may further include: a first metal electrode layer 34 located between the layer where the photosensitive modules 102 are located and the bias voltage metal layer 31, the first metal electrode layer 34 includes a plurality of first electrodes which are in one-to-one correspondence with the photosensitive modules 102, each of the first electrodes has a plurality of light transmitting holes, and the first electrodes are multiplexed as the light shading layer.

Figure 5:
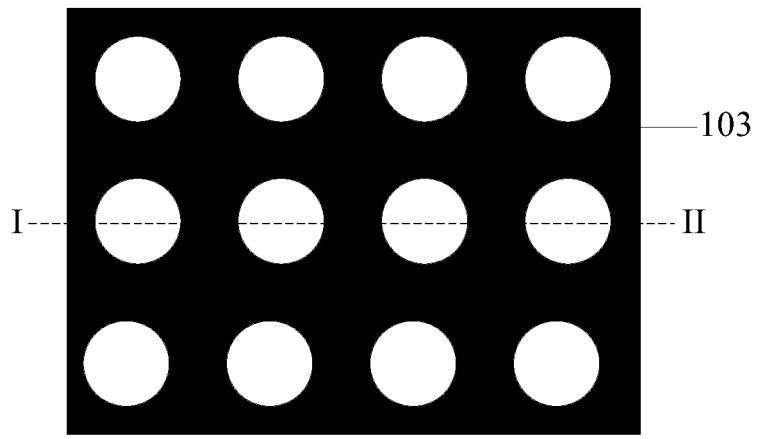
FIG. 5 is a first schematic structural diagram of a collimating optical structure provided by an embodiment of the present disclosure.

Specifically, in a fingerprint identification pixel, plane views of the light shading layers included in the collimating optical structures C are all as shown in FIG. 5, and a sectional structure diagram along a line I-II in FIG. 5 is as shown in FIG. 2 and FIG. 6 to FIG. 8. Besides, the bias voltage metal layer 31 specifically includes a plurality of bias lines in the related art. As bias voltage signals loaded on the bias lines are the same, each of the bias lines and the light shading layer which are arranged on the same layer may be an integrated structure or be independent from each other, which is not limited herein. The noise-reduction metal layer 32 includes: strip-shaped structures covering edge areas of a left side and a right side in the related art. As the strip-shaped structures need to be combined with the algorithm to achieve noise reduction, in order to prevent a light shading layer arranged on the same layer from influencing the strip-shaped structure, the strip-shaped structures and the light shading layer which are arranged on the same layer need to be independent from each other. The shielding metal layer 33 achieves a function of shielding signals of the display module in the related art. In order to make the fingerprint reflected light rays shine on the photosensitive modules 102 through the light transmitting holes, the portion of the shielding metal layer 33 not overlapped with the photosensitive modules 102 may be a light-proof metal layer or have a plurality of formed light transmitting holes, and the portion of the shielding metal layer 33 overlapped with the photosensitive modules 102 needs to have a plurality of formed light transmitting holes, so that the shielding metal layer 33 is multiplexed as a light shading layer. The first metal electrode layer 34 is composed of the plurality of first electrodes which are in one-to-one correspondence with the photosensitive modules 102, the first electrodes achieve a function of uniformly loading the bias voltage signals onto the photosensitive modules 102 and may shine on the photosensitive modules 102 through the light transmitting holes at the same time, namely, the first electrodes are multiplexed as a light shading layer included in the collimating optical structure C.

Figure 7:
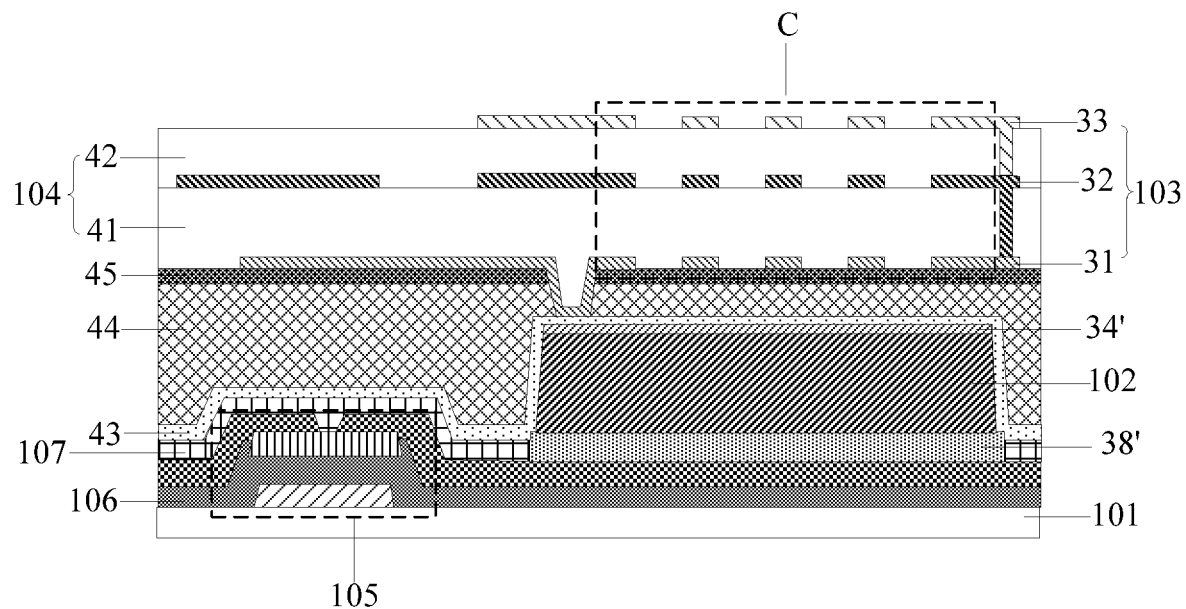
FIG. 7 is a third schematic structural diagram of a fingerprint identification substrate provided by an embodiment of the present disclosure.
Figure 8:
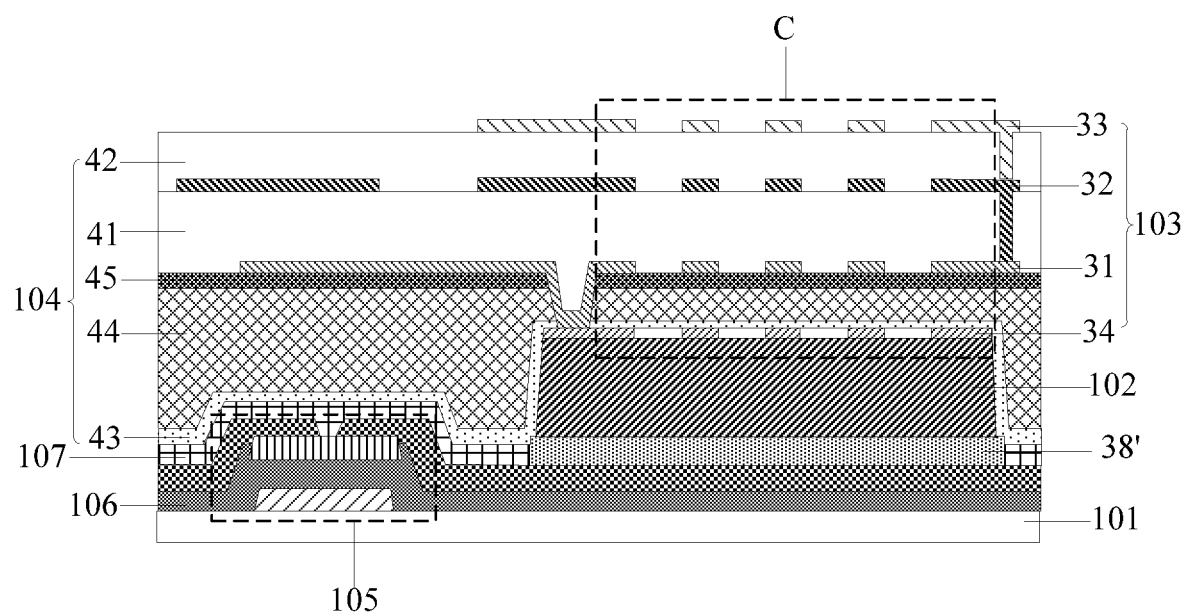
FIG. 8 is a fourth schematic structural diagram of a fingerprint identification substrate provided by an embodiment of the present disclosure.

In the fingerprint identification substrate provided by the embodiment of the present disclosure, in order to achieve a better shielding effect, as shown in FIG. 7 and FIG. 8, the light shading layers (namely, the portions of the film layers with the bias voltage metal layer 31, the noise-reduction metal layer 32 and the shielding metal layer 33 shared as the collimating optical structure C) may be in ground joint through via holes of the insulation layers 104. In some embodiments, as each function layer 103 is thin, specifically 0.2 μm to 0.4 μm, in order to avoid the situations that collapse and other poor conditions of patterns of the light shading layers between the adjacent light transmitting holes occur due to the existence of the via holes, then the shapes of the light transmitting holes are affected, and consequently the collimating effect is poor, the via holes may be formed in edge areas of the collimating optical structure C, e.g. orthographic projections of the via holes of the insulation layers 104 on the base substrate 101 and the orthographic projections of the photosensitive modules 102 on the base substrate 101 may be not overlapped mutually.

In the fingerprint identification substrate provided by the embodiment of the present disclosure, in order to relieve influence on the fingerprint identification accuracy due to ambient light, as shown in FIG. 2 and FIG. 5, an insulation layer 104 between the bias voltage metal layer 31 and the noise-reduction metal layer 32 is a first color-filtering resin layer 41, and an insulation layer 104 between the noise-reduction metal layer 32 and the shielding metal layer 33 is a second color-filtering resin layer 42.

In some embodiments, the first color-filtering resin layer 41 and the second color-filtering resin layer 42 are configured to filter out light being 580 nm or above, for example, by means of the first color-filtering resin layer 41 and the second color-filtering resin layer 42, a comprehensive transmitting ratio of the light being 580 nm or above may be smaller than 10%, and the comprehensive transmitting ratio of the light being 580 nm or below may be larger than 30%; or, the first color-filtering resin layer 41 and the second color-filtering resin layer 42 are configured to filter out light being 600 nm or above, for example, by means of the first color-filtering resin layer 41 and the second color-filtering resin layer 42, a comprehensive transmitting ratio of the light being 600 nm or above may be smaller than 10%, and the comprehensive transmitting ratio of the light being 600 nm or below may be larger than 30%. Specifically, a light-filtering spectral range of the first color-filtering resin layer 41 may be the same as or be different from that of the second color-filtering resin layer 42. Besides, the first color-filtering resin layer 41 and the second color-filtering resin layer 42 may be 0.5 μm to 3 μm in thickness, and during specific implementation, the first color-filtering resin layer 41 and the second color-filtering resin layer 42 may be the same or different in thickness.

In the fingerprint identification substrate provided by the embodiment of the present disclosure, as shown in FIG. 6 and FIG. 8, an insulation layer 104 between the bias voltage metal layer 31 and the first metal electrode layer 34 includes: a side wall protection layer 43, a flat layer 44 and a first passivation layer 45 arranged in a laminated mode.

The fingerprint identification substrate provided by the embodiment of the present disclosure, as shown in FIG. 2, FIG. 5 and FIG. 6 to FIG. 9, may further include: a transistor 105, a gate insulation layer 410 located between a gate of the transistor 105 and an active layer of the transistor 105, a second passivation layer 107 located on the sides, facing away from the active layer, of a source electrode and a drain electrode of the transistor 105, and a second electrode 38' located between the second passivation layer 107 and the photosensitive modules 102. Specifically, the second electrode 38' is electrically connected with the source electrode of the transistor 105 through a via hole penetrating through the second passivation layer 107. In some embodiments, when a working mode of the photosensitive modules 102 is passive (passive pixel sensor, PPS), the transistor 105 is unique in each fingerprint identification pixel; and when the working mode of the photosensitive modules 102 is active (active pixel sensor, APS), a reset transistor, a read out transistor and other transistors are further arranged in each fingerprint identification pixel in addition to the transistor 105. A material of the active layer may be amorphous silicon (a-Si), low temperature poly-silicon (LTPS) and other light-proof materials; and the gate, the source electrode and the drain electrode may generally be light-proof metal layers (e.g. Ti/Al/Ti or Mo/Al/Mo). Given that the active layer, the gate, the source electrode and the drain electrode on the sides, facing the base substrate 101, of the photosensitive modules 102 are light-proof, in the present disclosure, the film layers on the sides, facing away from the base substrate 101, of the photosensitive modules 102 may be shared as a collimating optical structure C, as described above; and the active layer, the metal layer where the gate is located, and the metal layer where the source electrode and the drain electrode are located may further be shared as the collimating optical structure C.

Figure 9:
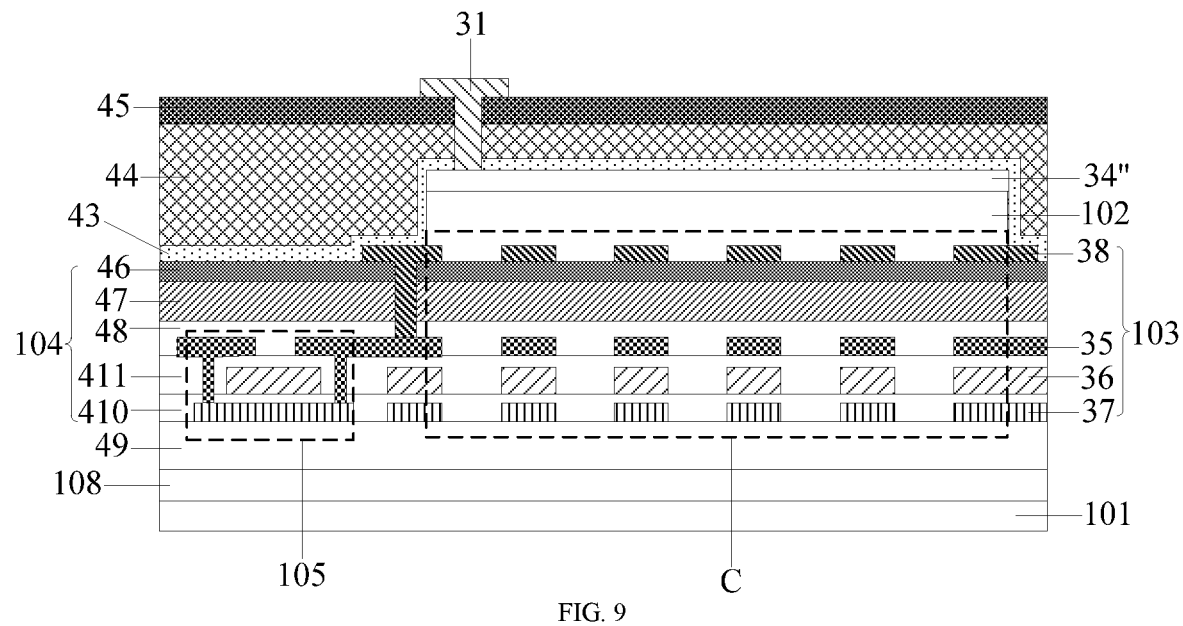
FIG. 9 is a fifth schematic structural diagram of a fingerprint identification substrate provided by an embodiment of the present disclosure.

As shown in FIG. 9, in the fingerprint identification substrate provided by the embodiment of the present disclosure, when the light entering side of each of the photosensitive modules 102 is the side facing the base substrate 101, the plurality of function layers 103 shared as the collimating optical structure C include: a source-drain metal layer 35, a gate metal layer 36 and an active layer 37 arranged on the sides, facing the base substrate 101, of the photosensitive modules 102 in sequence. Specifically, in order to avoid influence on functions of a source electrode and a drain electrode included in the source-drain metal layer 35, the source electrode and the drain electrode are independent from a light shading layer arranged on the same layer. In order to avoid influence on functions of the gate, the gate and a light shading layer which are arranged on the same layer are independent from each other. In order to avoid influence on functions of the active layer 37, the active layer 37 and a light shading layer which are arranged on the same layer are independent from each other.

Besides, the second electrode 38' is generally made of a metal material, and in order to prolong light paths of the collimating optical structure C and improve a fingerprint identification effect, a plurality of light transmitting holes may be further formed in the second electrode 38', so that the second electrode 38' is multiplexed as the light shading layer of the collimating optical structure C. Specifically, as shown in FIG. 9, the plurality of function layers 103 shared as the collimating optical structure C further include: a second metal electrode layer 38 located between the layer where the photosensitive modules 102 are located and the source-drain metal layer 35. The second metal electrode layer 38 includes the plurality of second electrodes 38' which are in one-to-one correspondence with the photosensitive modules 102 and multiplexed as the light shading layer.

Figure 10:
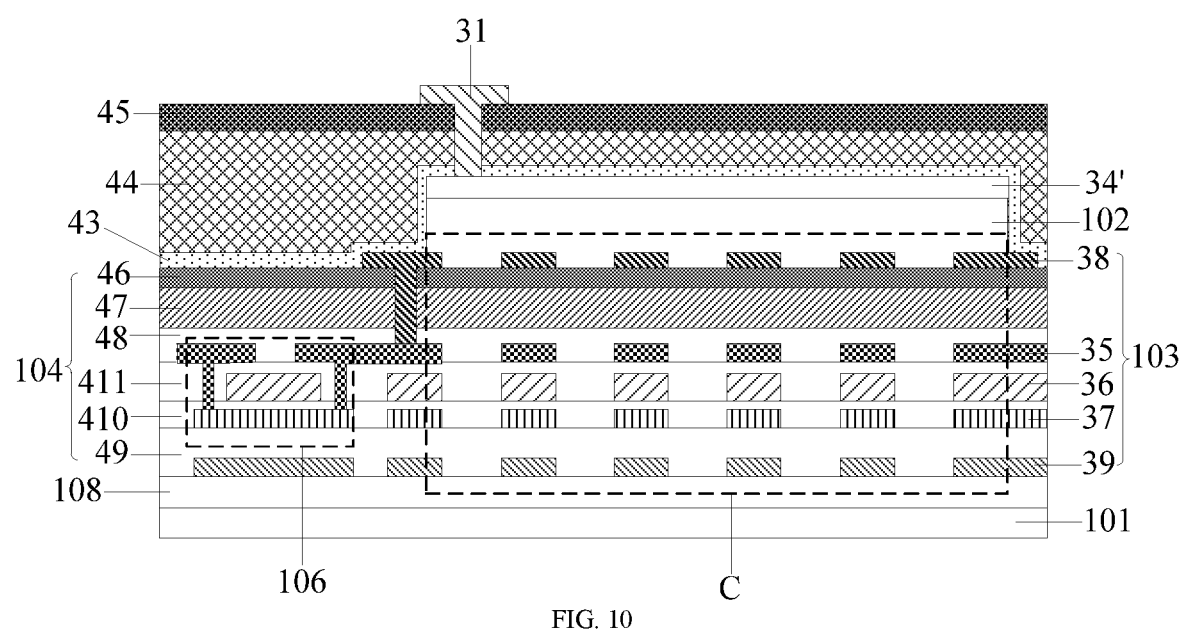
FIG. 10 is a sixth schematic structural diagram of a fingerprint identification substrate provided by an embodiment of the present disclosure.

Generally, in order to avoid influence on the active layer included in the transistor 105 due to outside light rays, a light shading metal layer 39 is arranged between the active layer included in the transistor 105 and the base substrate 101. In order to further prolong the light paths of the collimating optical structure C, a film layer where the light shading metal layer 39 is located may be shared as another light shading layer of the collimating optical structure C. Therefore, as shown in FIG. 10, in the fingerprint identification substrate provided by the embodiment of the present disclosure, the plurality of function layers 103 shared as the collimating optical structure C may further include: the light shading metal layer 39 located between the active layer 37 and the base substrate 101 and covering the active layer 37. As the light shading metal layer 39 is used to shade the outside ambient light, the light shading metal layer 39 and a light shading layer which are arranged on the same layer may be an integrated structure, or be independent from each other, which is not limited herein. Besides, in order to guarantee a shading function of the light shading metal layer 39 for the active layer 37, the light shading metal layer 39 needs to be maintained as a light-proof metal layer without change.

Figure 11:
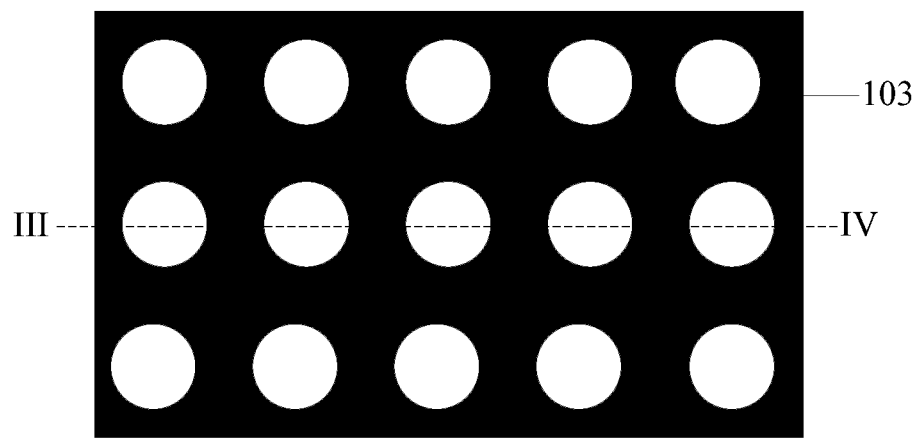
FIG. 11 is a second schematic structural diagram of a collimating optical structure provided by an embodiment of the present disclosure.

Specifically, FIG. 11 shows a plane view of the collimating optical structure C in one fingerprint identification pixel in film layers where the source-drain metal layer 35, the gate metal layer 36, the active layer 37, the second metal electrode layer 38 and the light shading metal layer 39 are located. A sectional view along a line III-IV in FIG. 10 is shown in FIG. 9, FIG. 10, FIG. 12 and FIG. 13. It may be seen from FIG. 9 to FIG. 13, in the present disclosure, the transistor 105 and the collimating optical structure C share the film layers where the active layer 37, the gate metal layer 36 and the source-drain metal layer 35 are located, the second metal electrode layer 38 is multiplexed as a light shading layer of the collimating optical structure C, and the light shading metal layer 39 is multiplexed as another light shading layer of the collimating optical structure C.

Figure 12:
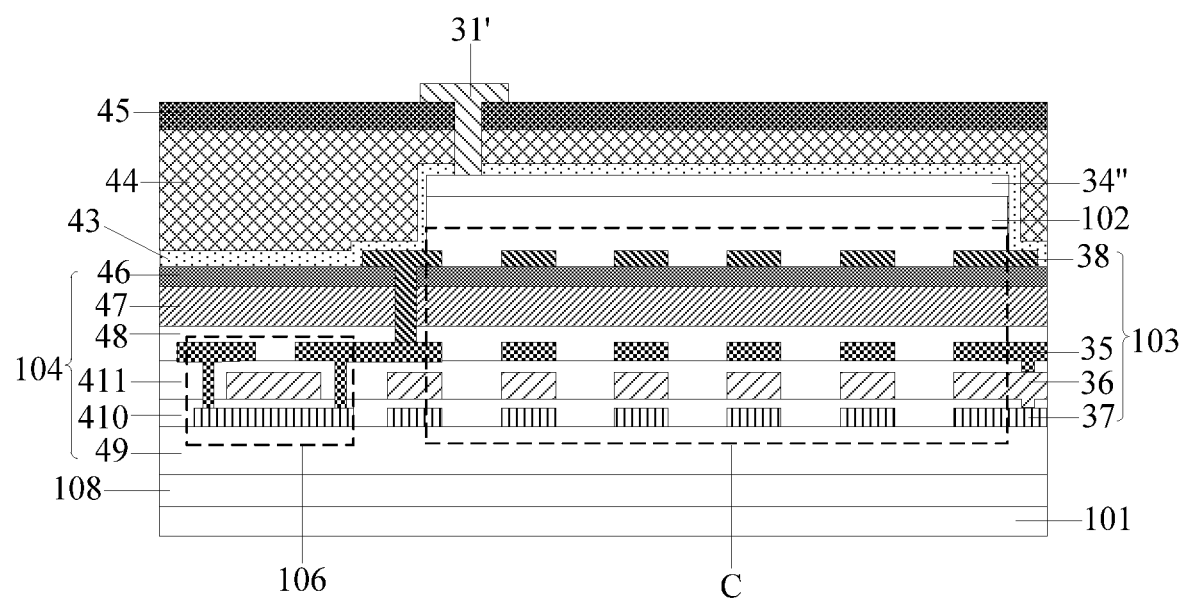
FIG. 12 is a seventh schematic structural diagram of a fingerprint identification substrate provided by an embodiment of the present disclosure.
Figure 13:
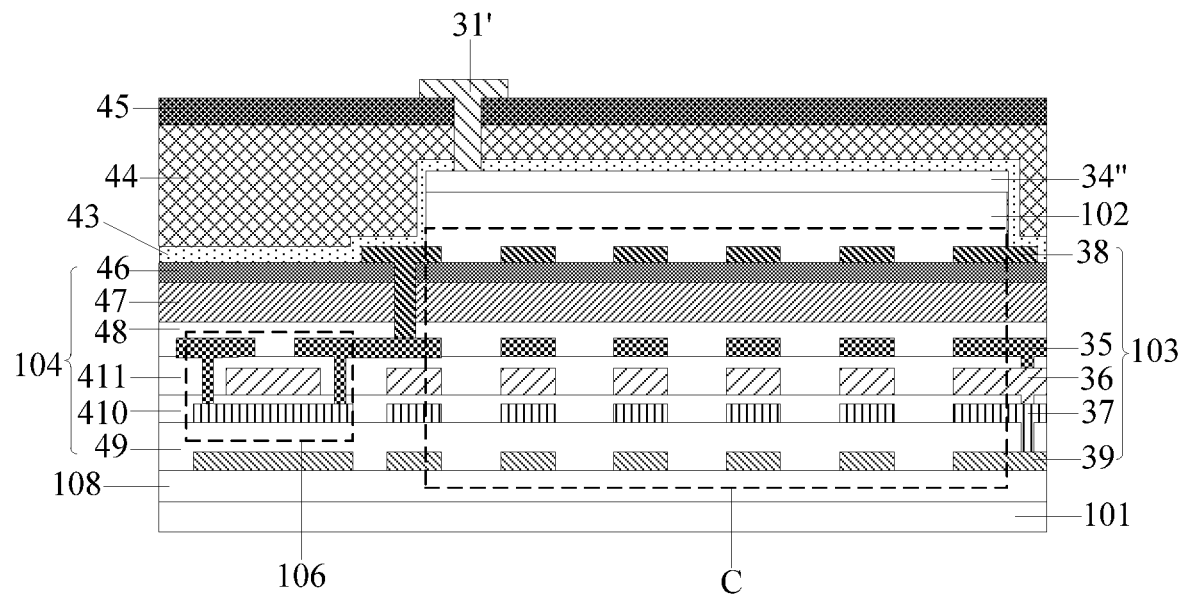
FIG. 13 is an eighth schematic structural diagram of a collimating optical structure provided by an embodiment of the present disclosure.

In the fingerprint identification substrate provided by the embodiment of the present disclosure, in order to achieve a better shielding effect, as shown in FIG. 12 and FIG. 13, the light shading layers included in the collimating optical structure C (namely, the portions of the film layers with the source-drain metal layer 35, the gate metal layer 36, the active layer 37 and the light shading metal layer 39 shared as the light shading layers) may be in ground joint through the via holes of the insulation layers 104. In some embodiments, as each light shading layer is thin, specifically 0.2 μm to 0.4 μm, in order to avoid the situations that collapse and other poor conditions of the patterns of the light shading layers between the adjacent light transmitting holes occur due to the existence of the via holes, then the shapes of the light transmitting holes are affected, and consequently the collimating effect is poor, the via holes may be formed in the edge areas of the collimating optical structure C, e.g. the orthographic projections of the via holes on the base substrate 101 and the orthographic projections of the photosensitive modules 102 on the base substrate 101 may be arranged to be not overlapped mutually.

In the fingerprint identification substrate provided by the embodiment of the present disclosure, in order to effectively filter out the ambient light and improve the accuracy of fingerprint identification, as shown in FIG. 9, FIG. 10, FIG. 12 and FIG. 13, an insulation layer 104 between the second metal electrode layer 38 and the source-drain metal layer 35 includes: a first insulation layer 46, a third color-filtering resin layer 47 and a second insulation layer 48 arranged in a laminated mode. The third color-filtering resin layer 47 is configured to filter out light being 580 nm or above. In some embodiments, by means of the third color-filtering resin layer 47, the comprehensive transmitting ratio of the light being 580 nm or above may be smaller than 10%, and the comprehensive transmitting ratio of the light being 580 nm or below may be larger than 30%. Or, the third color-filtering resin layer 47 is configured to filter out light being 600 nm or above. In some embodiments, by means of the third color-filtering resin layer 47, the comprehensive transmitting ratio of the light being 600 nm or above may be smaller than 10%, and the comprehensive transmitting ratio of the light being 600 nm or below may be larger than 30%. In some embodiments, the third color-filtering resin layer 47 may be 0.5 μm to 3 μm in thickness.

In the fingerprint identification substrate provided by the embodiment of the present disclosure, in order to effectively filter out the ambient light and improve the accuracy of fingerprint identification, as shown in FIG. 12 and FIG. 13, an insulation layer 104 between the light shading metal layer 39 and the active layer 37 is a fourth color-filtering resin layer 49, an insulation layer 104 between the active layer 37 and the gate metal layer 36 is a gate insulation layer 410, and an insulation layer 104 between the gate metal layer 36 and the source-drain metal layer 35 is an interlayer dielectric layer 411. The fourth color-filtering resin layer 49 is configured to filter out light being 580 nm or above. In some embodiments, by means of the fourth color-filtering resin layer 49, the comprehensive transmitting ratio of the light being 580 nm or above may be smaller than 10%, and the comprehensive transmitting ratio of the light being 580 nm or below may be larger than 30%. Or, the fourth color-filtering resin layer 49 is configured to filter out light being 600 nm or above. In some embodiments, by means of the fourth color-filtering resin layer 49, the comprehensive transmitting ratio of the light being 600 nm or above may be smaller than 10%, and the comprehensive transmitting ratio of the light being 600 nm or below may be larger than 30%. In some embodiments, the fourth color-filtering resin layer 49 may be 0.5 μm to 3 μm in thickness.

In the fingerprint identification substrate provided by the embodiment of the present disclosure, in order to prevent the ambient light from entering the photosensitive modules 102 from the sides, facing away from the collimating optical structure C, of the photosensitive modules 102, the transparent electrode 34' need to be replaced by light-proof electrode 34", as shown in FIG. 12 and FIG. 13. At the moment, the bias voltage metal layer 31 only includes bias lines 31', specifically bias voltage signals may be loaded on the light-proof electrodes 34" through the bias lines 31'.

Besides, it is worth noting that when the fingerprint identification substrate shown in the FIG. 9, FIG. 10, FIG. 12 and FIG. 13 is adopted to cooperate with the display module for fingerprint identification, the fingerprint identification substrate needs to be inverted, the base substrate 101 is adjacent to the display module, and thus the fingerprint reflected light rays may shine on the photosensitive modules 102 through the collimating optical structures C. In order to shorten a distance from the fingerprint identification substrate to a finger, the base substrate 101 preferably uses a flexible polyimide (PI) material, and the polyimide material may be made into a thin film layer, with the thickness being as small as 10 μm-20 μm.

Figure 14:
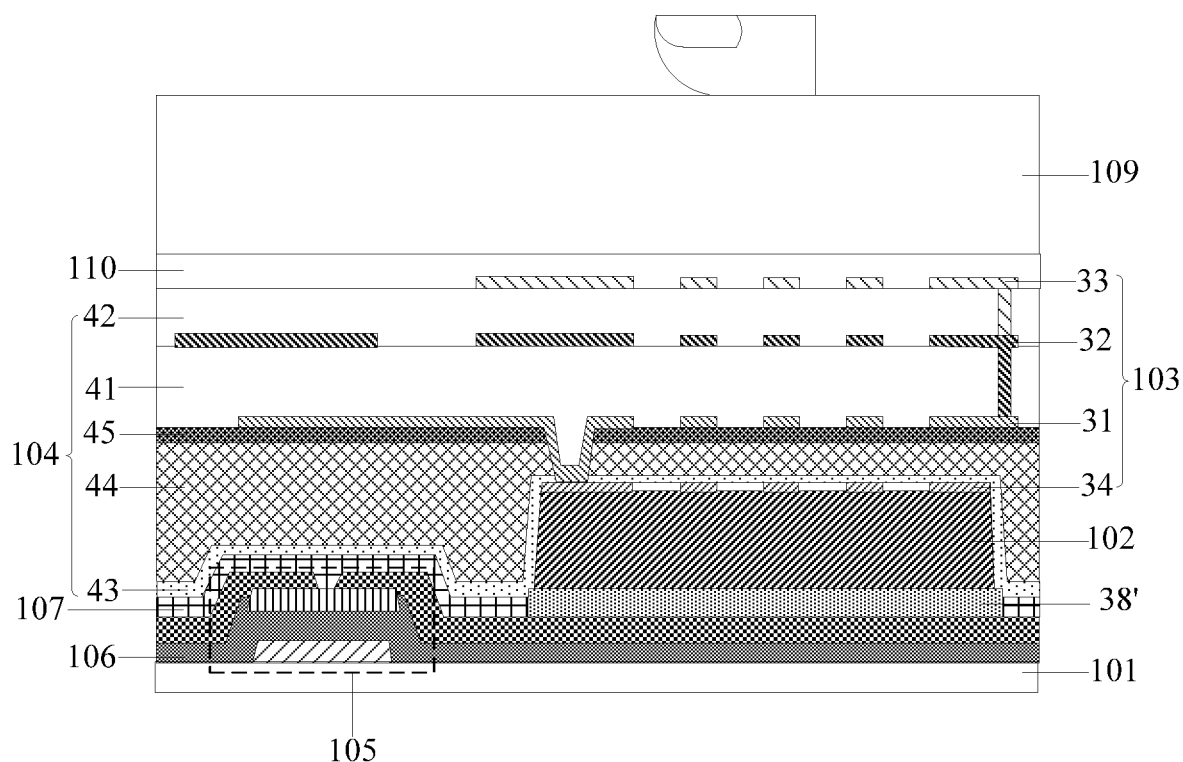
FIG. 14 is a first schematic structural diagram of a display device provided by an embodiment of the present disclosure.
Figure 15:
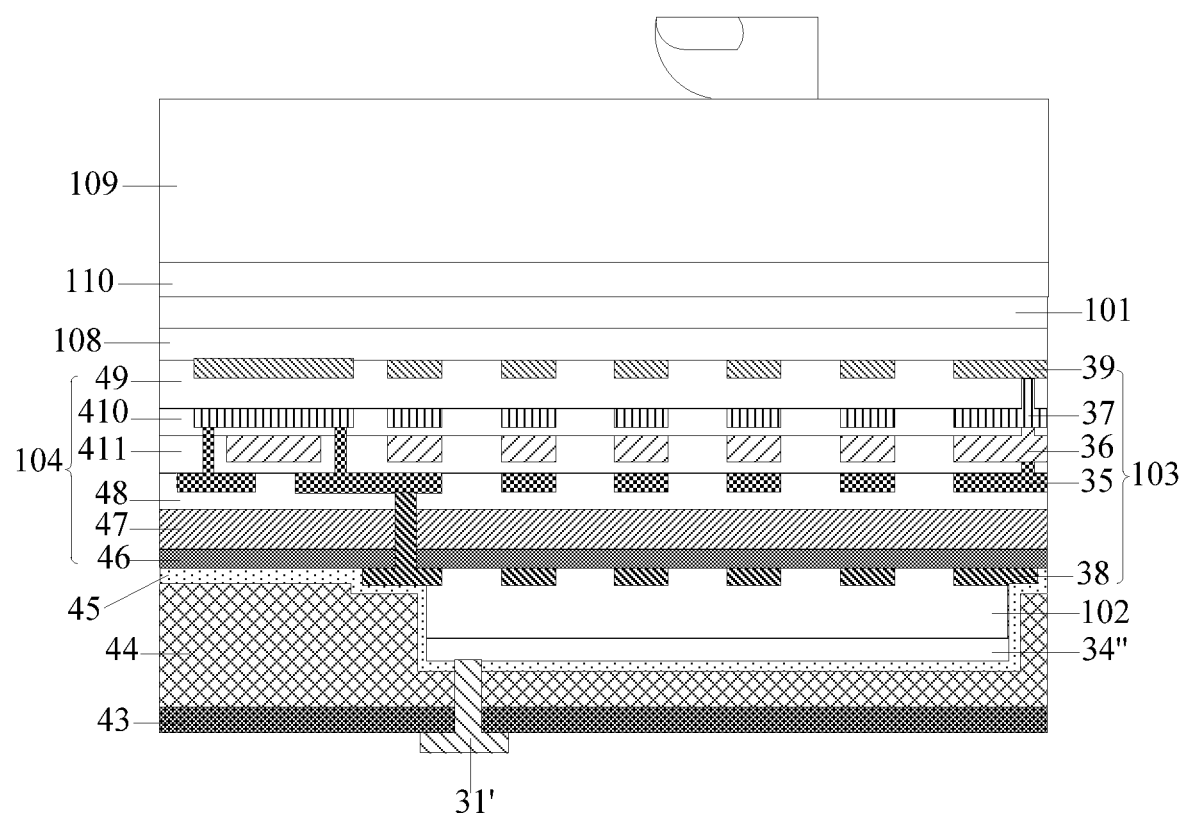
FIG. 15 is a second schematic structural diagram of a display device provided by an embodiment of the present disclosure.

On the basis of the same inventive concept, an embodiment of the present disclosure provides a display device, as shown in FIG. 14 and FIG. 15, including: the fingerprint identification substrate provided by the embodiment of the present disclosure, and a self-luminous display module 109 located on a light entering side of the fingerprint identification substrate. In some embodiments, the fingerprint identification substrate and the self-luminous display module 109 may be attached through an optically clear adhesive (OCA) layer 110 or be in direct physical contact. Besides, the self-luminous display module 109 may be an OLED display module, a QLED display module and the like. A luminous mode of the self-luminous display module 109 may be a top-emitting mode or a bottom-emitting mode. Generally, the self-luminous display module in the top-emitting mode is suitable for small-size display products like a mobile phone, etc., and the self-luminous display module in the bottom-emitting mode is suitable for large-size display products like a television, etc. During specific application, light rays emitted by the self-luminous display module 109 are reflected by a finger and then sequentially pass through the self-luminous display module 109 and the collimating optical structures C to shine on the photosensitive modules 102 so as to achieve fingerprint identification.

In some embodiments, the display device may be a foldable mobile phone, a tablet computer, a television, a displayer, a laptop, a digital photo frame, a navigator, a smart watch, a fitness wristband, a personal digital assistant and any other products or parts with a display function. Those ordinarily skilled in the art should understand that the display device include other necessary components, which is omitted herein without limitation on the present disclosure. Besides, as a principle for solving problems of the display device is similar to a principle for solving problems of the fingerprint identification substrate, the implementation of the display device may refer to the embodiments of the fingerprint identification substrate, and repetitions are omitted herein.

The fingerprint identification substrate and the display device provided by the embodiments of the present disclosure include: the base substrate, the plurality of photosensitive modules located on the base substrate, the collimating optical structure located on the light entering sides of the photosensitive modules, the plurality of function layers and the insulation layer between every two adjacent function layers. The photosensitive modules are configured to collect the light rays reflected by a fingerprint. The collimating optical structures include the light shading layers and the light transmitting layers arranged alternately. Each of the light shading layers has the plurality of light transmitting holes, and the orthographic projections of the light transmitting holes on the base substrate are located in the orthographic projections of the photosensitive modules on the base substrate. Light transmitting holes of one of the light shading layers and light transmitting holes of another of the light shading layers are mutually overlapped in the direction perpendicular to the base substrate. The mutually-overlapped light transmitting holes and the function layers between the adjacent light transmitting holes form the collimating optical structure. Each of the light shading layers and one of the function layers share the same film layer, and the each of the light transmitting layers and one of the insulation layers multiplex the same film layer. All the light shading layers included in the collimating optical structures and all the function layers included in the fingerprint identification substrate are in one-to-one correspondence on the same layers, all the light transmitting layers included in the collimating optical structures and all the insulation layers included in the fingerprint identification substrate are multiplexed in a one-to-one correspondence mode, the collimating optical structures are embedded into the fingerprint identification substrate, thus the fingerprint identification substrate have the functions of the collimating optical structures, the collimating optical structures do not need to be arranged independently, and the thickness is reduced.

Apparently, those skilled in the art may make various changes and transformations for the present disclosure without departing from the spirit and the scope of the present disclosure. In this case, if these changes and transformations of the present disclosure fall within the scope of claims and the equivalent art thereof, the present disclosure intends to include these changes and transformations.

What is claimed is:

1. A fingerprint identification substrate, comprising:
a base substrate,
a plurality of photosensitive modules on the base substrate,
a collimating optical structure arranged on light entering sides of the plurality of photosensitive modules,
a plurality of function layers, and
an insulation layer between every two adjacent function layers;
wherein the photosensitive modules are configured to collect light rays reflected by a fingerprint; and
the collimating optical structure comprises light shading layers and light transmitting layers arranged alternately;
wherein each of the light shading layers has a plurality of light transmitting holes,
orthographic projections of the plurality of light transmitting holes on the base substrate are in orthographic projections of the photosensitive modules on the base substrate,
light transmitting holes of one of the light shading layers and light transmitting holes of another of the light shading layers are mutually overlapped in a direction perpendicular to the base substrate,
each of the light shading layers and one of the function layers share one same film layer, and
each of the light transmitting layers and one of the insulation layers multiplex another same film layer.

2. The fingerprint identification substrate according to claim 1, wherein centers of the orthographic projections of the mutually overlapped light transmitting holes on the base substrate are the same.

3. The fingerprint identification substrate according to claim 2, wherein the orthographic projections of the mutually overlapped light transmitting holes on the base substrate completely coincide.

4. The fingerprint identification substrate according to claim 1, wherein a diameter of each of the light transmitting holes is larger than or equal to 2 μm but smaller than or equal to 5 μm.

5. The fingerprint identification substrate according to claim 1, wherein the light entering side of each of the photosensitive modules is one side facing away from the base substrate;
the plurality of function layers comprise: a bias voltage metal layer, a noise-reduction metal layer and a shielding metal layer arranged on the sides, facing away from the base substrate, of the photosensitive modules in sequence;
the bias voltage metal layer and a light shading layer which are arranged on a first same layer are independent from each other;
the noise-reduction metal layer and a light shading layer which are arranged on a second same layer are independent from each other; and
the shielding metal layer is multiplexed as a light shading layer arranged on a third same layer with the shielding metal layer;
wherein the one same film layer is the first same layer, or the second same layer, or the third same layer.

6. The fingerprint identification substrate according to claim 5, wherein the plurality of function layers further comprise: a first metal electrode layer arranged between a layer where the photosensitive modules are arranged and the bias voltage metal layer;
the first metal electrode layer comprises a plurality of first electrodes in one-to-one correspondence with the photosensitive modules; and
the first electrodes are multiplexed as a light shading layer.

7. The fingerprint identification substrate according to claim 5, wherein an insulation layer between the bias voltage metal layer and the noise-reduction metal layer is a first color-filtering resin layer, and
an insulation layer between the noise-reduction metal layer and the shielding metal layer is a second color-filtering resin layer.

8. The fingerprint identification substrate according to claim 1, wherein the light entering side of each of the photosensitive modules is one side facing the base substrate;
the plurality of function layers comprise: a source-drain metal layer, a gate metal layer and an active layer arranged on the sides, facing the base substrate, of the photosensitive modules in sequence; and
the source-drain metal layer and a light shading layer which are arranged on a fourth same layer are independent from each other, the gate metal layer and a light shading layer which are arranged on a fifth same layer are independent from each other, and the active layer and a light shading layer which are arranged on a sixth same layer are independent from each other;
wherein the one same film layer is the fourth same layer, or the fifth same layer, or the sixth same layer, or a seventh same layer, or an eighth same layer.

9. The fingerprint identification substrate according to claim 8, wherein the plurality of function layers further comprise: a second metal electrode layer between a layer where the photosensitive modules are arranged and the source-drain metal layer;
the second metal electrode layer comprises a plurality of second electrodes in one-to-one correspondence with the photosensitive modules; and the second electrodes are multiplexed as a light shading layer arranged on the seventh same layer with the second electrodes.

10. The fingerprint identification substrate according to claim 9, wherein an insulation layer between the second metal electrode layer and the source-drain metal layer comprises: a first insulation layer, a third color-filtering resin layer and a second insulation layer arranged in a laminated mode.

11. The fingerprint identification substrate according to claim 8, wherein the plurality of function layers further comprise: a light shading metal layer arranged between the active layer and the base substrate and covering the active layer, and
the light shading metal layer and a light shading layer which are arranged on the eighth same layer are an integrated structure.

12. The fingerprint identification substrate according to claim 11, wherein an insulation layer between the light shading metal layer and the active layer is a fourth color-filtering resin layer, an insulation layer between the active layer and the gate metal layer is a gate insulation layer, and an insulation layer between the gate metal layer and the source-drain metal layer is an interlayer dielectric layer.

13. The fingerprint identification substrate according to claim 5, wherein the light shading layers are in ground joint through via holes of the insulation layers.

14. The fingerprint identification substrate according to claim 13, wherein orthographic projections of the via holes of the insulation layers on the base substrate and the orthographic projections of the photosensitive modules on the base substrate are not overlapped mutually.

15. A display device, comprising:

the fingerprint identification substrate according to claim 1, and a self-luminous display module arranged on a light entering side of the fingerprint identification substrate.

* * * * *